United States Patent [19]

Iwahashi et al.

[11] Patent Number: 4,495,693
[45] Date of Patent: Jan. 29, 1985

[54] METHOD OF INTEGRATING MOS DEVICES OF DOUBLE AND SINGLE GATE STRUCTURE

[75] Inventors: Hiroshi Iwahashi, Yokohama; Masamichi Asano; Kuniyoshi Yoskikawa, both of Tokyo; Masazi Mito, Yokohama, all of Japan

[73] Assignee: Tokyo Shibaura Denki Kabushiki Kaisha, Japan

[21] Appl. No.: 487,765

[22] Filed: Apr. 22, 1983

Related U.S. Application Data

[62] Division of Ser. No. 273,245, Jun. 12, 1981.

[30] Foreign Application Priority Data

Jun. 17, 1980 [JP] Japan ................... 55-81724

[51] Int. Cl.³ ............... G11C 11/40; B01J 17/00; H01L 29/27
[52] U.S. Cl. .................... 29/571; 29/576 B; 148/1.5; 148/187; 357/23; 357/91
[58] Field of Search ............ 148/1.5, 187; 29/571, 29/576 B; 357/23, 91

[56] References Cited

U.S. PATENT DOCUMENTS

| | | | |
|---|---|---|---|
| 3,868,187 | 2/1975 | Masouka | 357/23 |
| 3,984,822 | 10/1976 | Simko et al. | 340/173 R |
| 4,122,544 | 10/1978 | McElroy | 365/185 |
| 4,128,773 | 12/1978 | Troutman et al. | |
| 4,142,926 | 3/1979 | Morgan | 148/187 |
| 4,203,158 | 5/1980 | Bentchowsky et al. | 365/185 |
| 4,247,918 | 1/1981 | Iwahashi et al. | 365/185 |
| 4,258,378 | 3/1981 | Wall | 357/41 |
| 4,278,989 | 7/1981 | Baba et al. | |
| 4,288,256 | 9/1981 | Ning et al. | 148/1.5 |
| 4,292,728 | 10/1981 | Endo | 29/571 |
| 4,302,766 | 11/1981 | Guterman et al. | 357/41 |
| 4,330,850 | 5/1982 | Jacobs et al. | 365/185 |
| 4,355,455 | 10/1982 | Boettcher | 29/571 |
| 4,409,723 | 10/1983 | Harari | 29/571 |

FOREIGN PATENT DOCUMENTS 2759040 7/1979 Fed. Rep. of Germany .
54-13798 10/1979 Japan .
55-38664 3/1980 Japan .

*Primary Examiner*—Upendra Roy
*Attorney, Agent, or Firm*—Finnegan, Henderson, Farabow, Garrett & Dunner

[57] ABSTRACT

A nonvolatile semiconductor memory device is provided having a MOS transistor and a floating gate type MOS transistor. The length of an overlap between a floating gate and a drain region of the floating gate type MOS transistor is made smaller than that of an overlap between the gate and the drain region of the MOS transistor.

9 Claims, 38 Drawing Figures

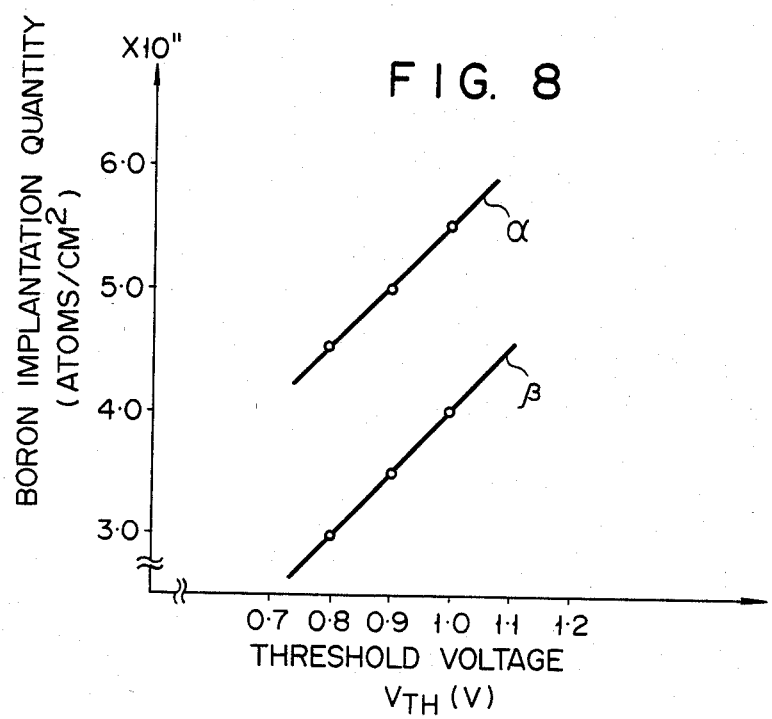
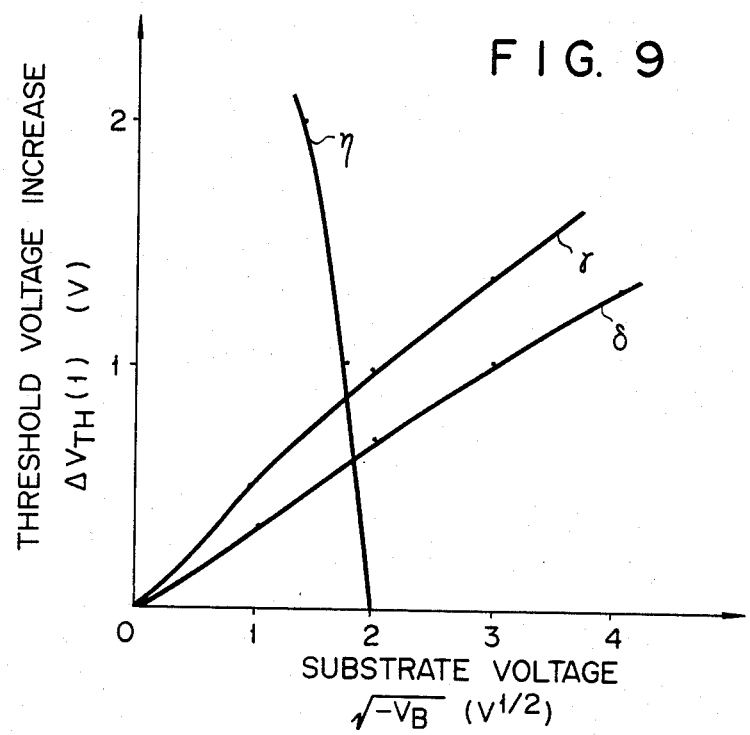

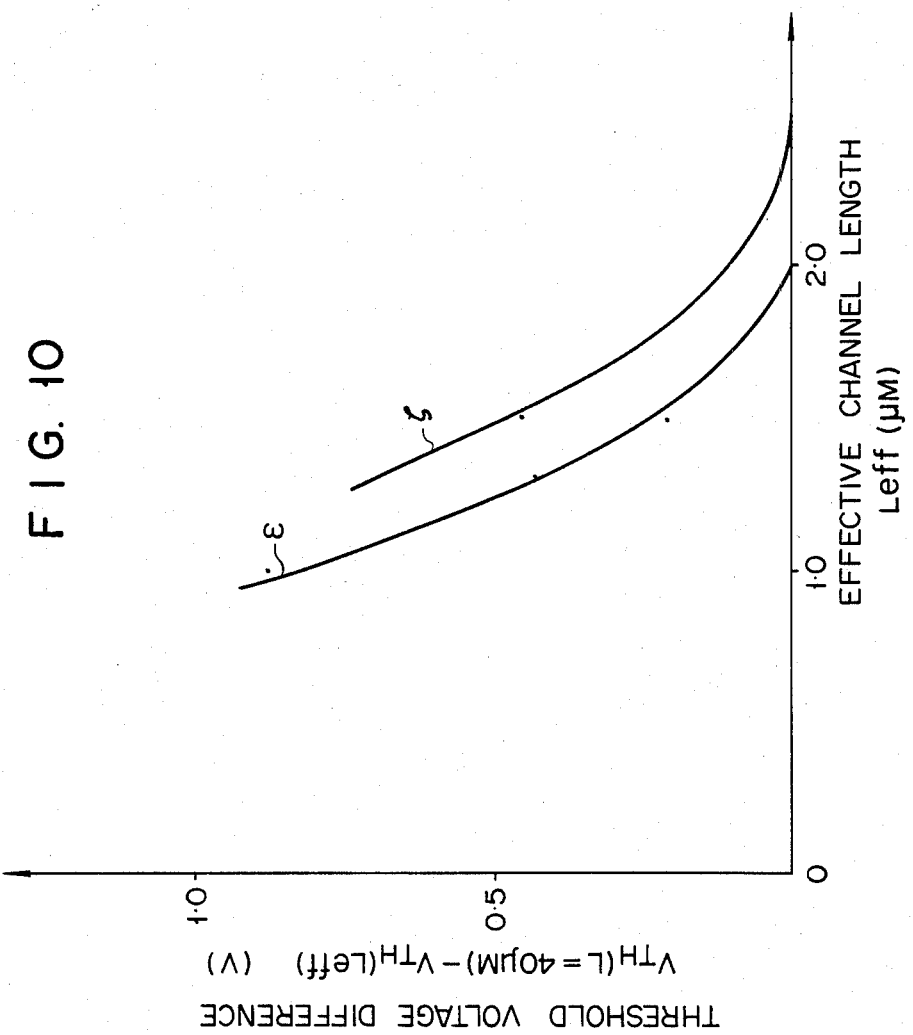

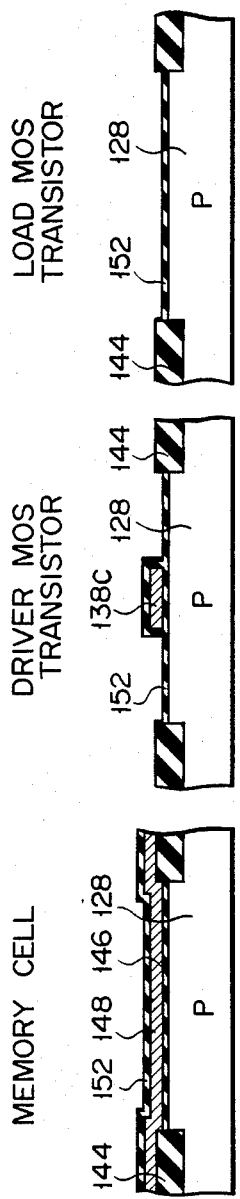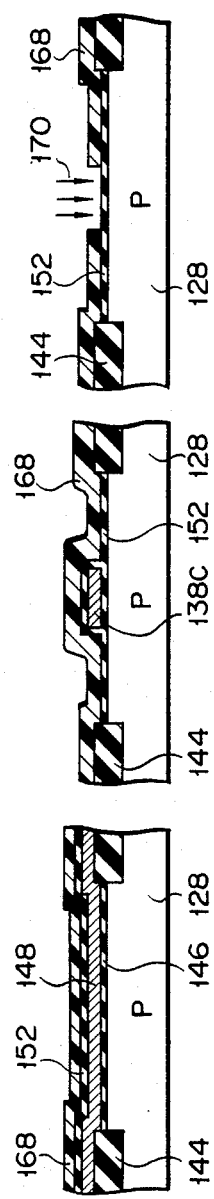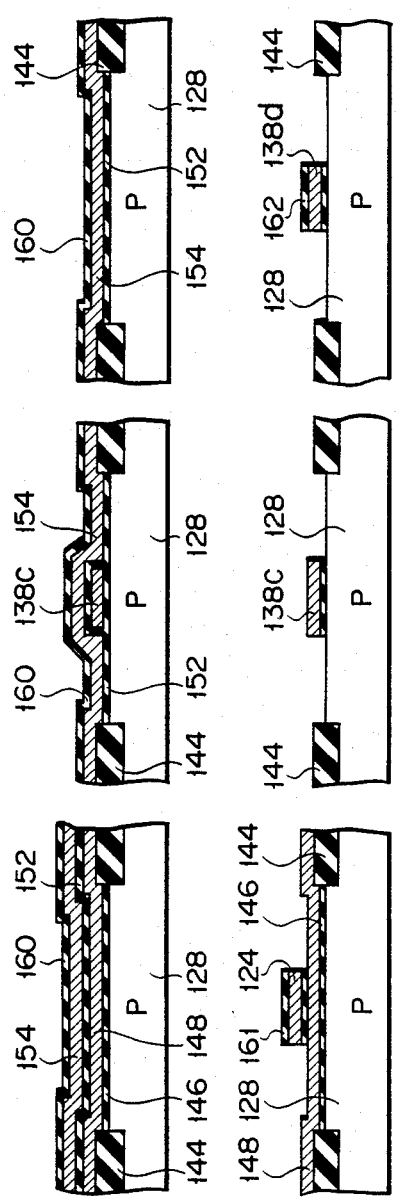

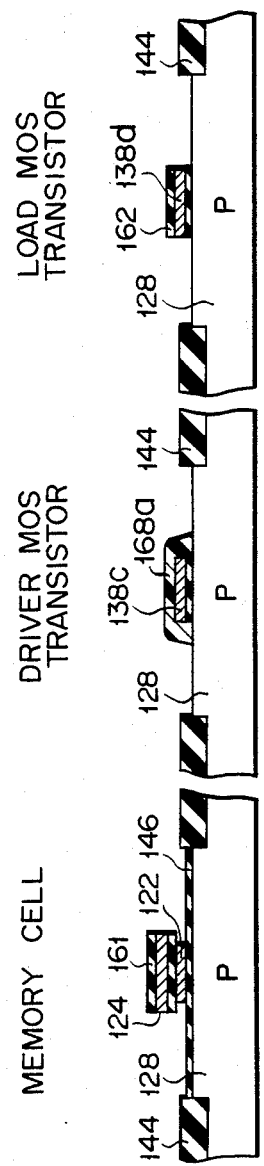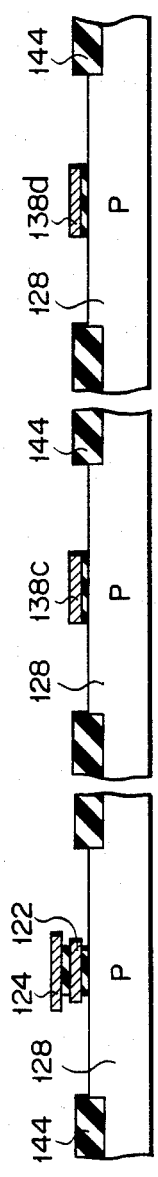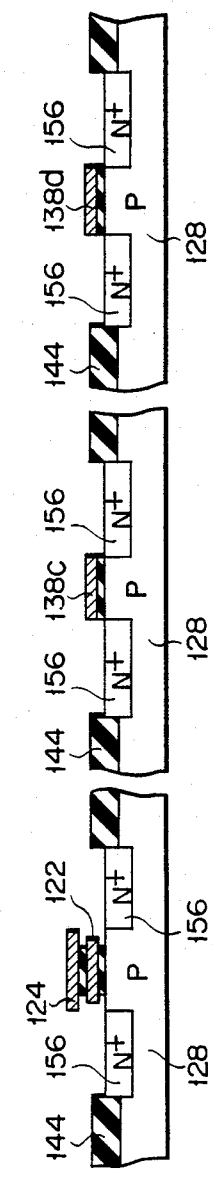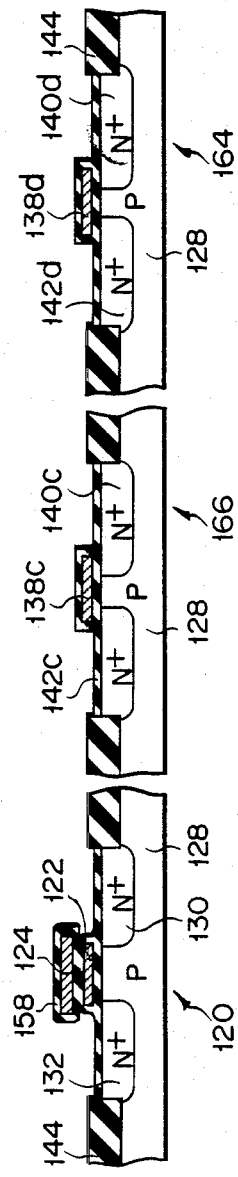

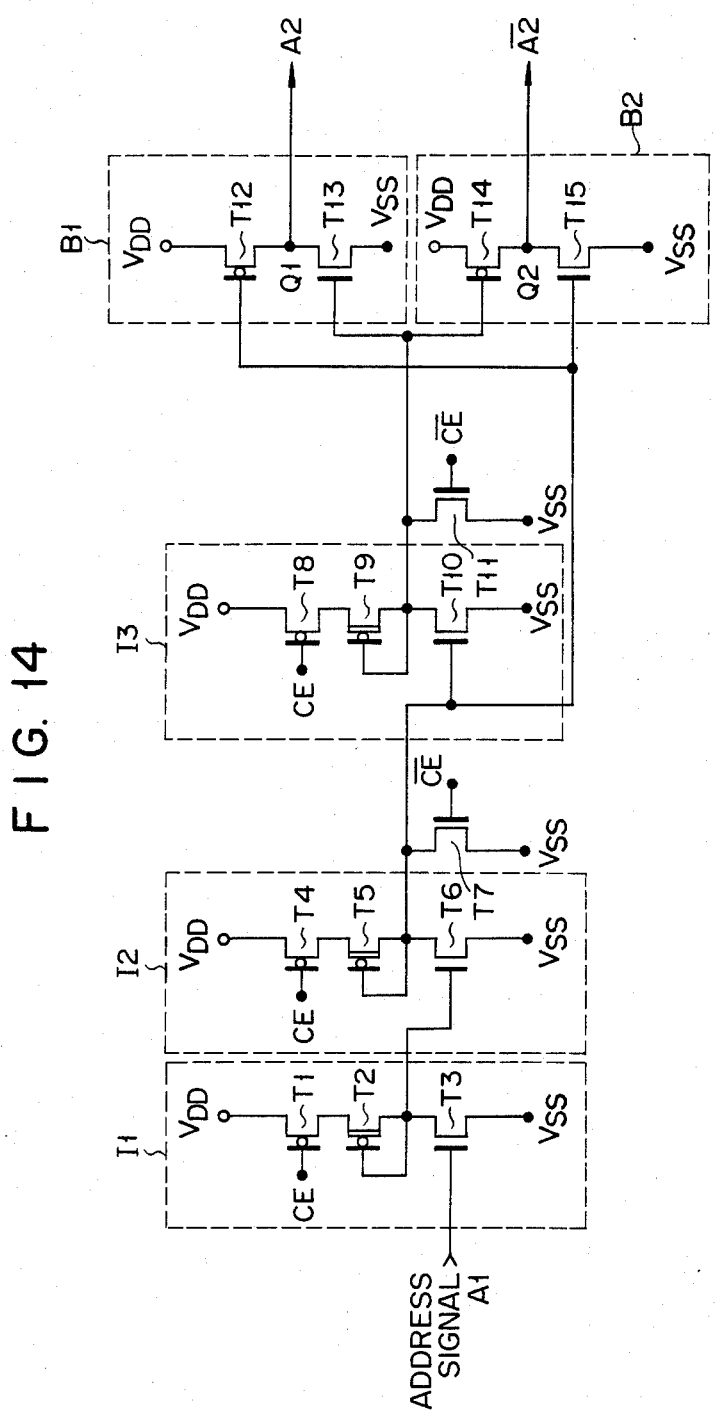
F I G. 14

METHOD OF INTEGRATING MOS DEVICES OF DOUBLE AND SINGLE GATE STRUCTURE

This is a division of application Ser. No. 273,245 filed June 12, 1981.

BACKGROUND OF THE INVENTION

1. Field of the Invention

This invention relates to a nonvolatile semiconductor memory device comprised of MOS transistors having a floating gate, and a method for manufacturing the same.

2. Description of the Prior Art

A MOS transistor having a floating gate is disclosed in U.S. Pat. Nos. 3,868,187 and 3,984,822. FIGS. 1 to 3 show a nonvolatile semiconductor memory cell 20 having an ordinary floating gate. FIG. 1 shows a plan view of the nonvolatile semiconductor memory cell, FIG. 2 is a cross-sectional view as taken along line II—II in FIG. 1 and FIG. 3 is a cross-sectional view as taken along line III—III in FIG. 1. The memory cell 20 of this type is known in the art. FIGS. 2 and 3 show the state in which capacitances are simultaneously formed in the memory cell 20. The memory cell 20 has a capacitance C1 between a floating gate 22 and a control gate 24, a capacitance C2 between the floating gate 22 and a channel region 26, a capacitance C3 between the floating gate 22 and a P-type semiconductor substrate 28 except for the channel region 26, a capacitance C4 between the floating gate 22 and an N+-type drain region 30 and a capacitance C5 between the floating gate 22 and an N+-type source region 32. The floating gate 22 and control gate 24 are formed of a polycrystalline silicon. The floating gate 22, control gate 24 and semiconductor substrate 28 are insulated from each other by an insulating layer 34 made of $SiO_2$.

Control gates 24 of memory cells 20 are connected to the corresponding row lines of a semiconductor memory and drain regions 30 of the memory cells 20 are connected to column lines of the semiconductor memory to provide a memory matrix. When data is written into the memory cell 20, a high voltage of, for example, 25 V is applied to selected row and column lines of the semiconductor memory.

Since the drain regions of the other memory cells 20 are connected to the selected column lines and the control gates 24 of the other memory cells 20 are connected to nonselected row lines (zero voltage is applied to the control gate 24), no data is written to the other memory cells 20. With the drain voltage of the other memory cells 20 (i.e. the memory cells each having the control gate 24 to which zero volt is applied and the drain 30 to which high voltage is applied) indicated by $V_D$, the potential $V_F$ of the floating gate 22 of the memory cell 20 will be given below $$V_F = \frac{C4}{C1 + C2 + C3 + C4 + C5} V_D, \quad (1)$$

bearing the above-mentioned capacitances C1 to C5 in mind.

For simplicity, the capacitance C4 between the drain region 30 and the floating gate 22 is determined by a distance (lateral diffusion distance) $X_j$ over which the drain region 30 extends toward the substrate portion below the floating gate 22 (see FIG. 2). As generally used in the art, the width FW of the floating gate is assumed to be three times the channel width. The length of the floating gate is represented by FL.

Now assume that at FL=5 $\mu$m and $X_j$=1.2 $\mu$m the thickness of the gate oxide is 1,000 Å (0.1 $\mu$m), that a distance between the floating gate 22 and the control gate 24 is 1,500 Å (0.15 $\mu$m) and that a distance between the floating gate 22 and the semiconductor substrate 28 except for the channel region 26 is 7,000 Å (0.7 $\mu$m). The capacitance C of the capacitor of an area S as prepared by filling a material of a dielectric constant $\epsilon$ between two conductors spaced a distance d apart from each other is given below, $$C = \epsilon \frac{S}{d}$$

Thus, $$\frac{C4}{C1 + C2 + C3 + C4 + C5} = \frac{\frac{CW \cdot X_j}{0.1}}{\frac{FL \cdot FW}{0.15} + \frac{(FL - 2X_j)CW}{0.1} + \frac{FL \cdot CW}{0.7} \times 2 + \frac{CW \cdot X_j}{0.1} + \frac{CW \cdot X_j}{0.1}} \approx 0.073$$

From this, $$V_F = 0.073 V_D \quad (2)$$

If high voltage is applied the control gate and the drain region of one memory cell so as to inject electrons into the floating gate, a potential on the floating gate of the nonselected memory cells (memory cells each of whose control gate voltage is zero) sharing the column line with the one memory cell will be 1.46 V from Equation (2) when the each drain voltage $V_D$ of the nonselected memory cells is 20 V. That is, the nonselected memory cells are in the same state as when 1.46 V is applied to the floating gate. Thus, in the writing operation, the floating gate voltage of the nonselected memory cell indicates 1.46 V by only applying 20 V to the drain of the memory cell. Accordingly, the threshold voltage $V_{TH}$ of the memory cell as measured from the floating gate voltage should be set at 1.46 V or above. If, however, the threshold voltage is raised the current flowing through the memory cell is reduced when data is read out therefrom. Consequently, it consumes a long time to charge or discharge the column line, causing data to be read out of the memory cell at a low speed. Hitherto, therefore, the threshold voltage has been lowered to such extent as allows negligible leakage current to flow through the nonselected memory cell in the writing operation. In the ordinary memory cell, the above-mentioned threshold voltage $V_{TH}$ is set at about 1 V so as to read out the stored data of memory cells rapidly. That is, when the floating gate voltage is greater than 1 V, the memory cell transistor is rendered conductive. When in this case 20 V is applied to the selected column line in the writing operation, electric current, though smaller, flows through the nonselected memory cell connected to the selected column line. If a greater memory capacity is involved i.e. more memory cell is formed on the same semiconductor chip, more memory cell is connected to the same column line and the sum of electric currents through the nonselected memory cells becomes a level which can not be disregarded. As a result, a problem tends to arise that due to such leakage current a potential on the column line becomes lower at writing operation and thus a longer writing time will be required. Moreover, since at the writing time electric current flows through the nonselected memory cell, an erroneous writing operation tends to occur with respect to the nonselected memory cell.

In order to cope with the lowering of the potential on the column line, a method is proposed which provides a greater current carrying capability to a load transistor for use in a data writing operation. Suppose that a writing operation is effected with respect to the nonselected transistor connected to the same column line (electrons are injected into the floating gate) and thus the threshold voltage $V_{TH}$ becomes greater. In this case, excess current flows from the load transistor to the selected transistor, there being a risk that the memory cell will suffer breakdown.

According to Equation (1) it is necessary that in order to make a potential on the floating gate small in the state of a predetermined drain potential $V_D$ the capacitance C4 between the floating gate and the drain region be decreased. In order to decrease the capacitance C4 without changing the size, for example the channel length, of the memory cell, all that is necessary is to decrease the lateral diffusion distance $X_j$ of the drain region.

The drain region of the conventional memory cell 20 is self-aligned with the floating gate 22 as a mask as shown in FIG. 4. In this case, the gate electrode 38 of a MOS transistor 36 of a peripheral circuit is formed simultaneously with the formation of the above-mentioned floating gate 22. The drain region 40 and source region 42 of the MOS transistor 36 are self-aligned with the gate 38 as a mask. In consequence, the drain and source regions of the memory cell 20 and the MOS transistor 36 of a peripheral circuit, each, has the same lateral diffusion distance $X_j$. If in this case the diffusion distance $X_j$ is decreased to make the capacitance C4 smaller, the junction depth of the memory cell 20 and the MOS transistor 36 of peripheral circuit becomes smaller, causing the breakdown voltage of the PN junction to be lowered. In order to decrease the diffusion distance $X_j$ with the breakdown voltage maintained at a high level, it is only necessary to decrease the impurity doping concentration of the N+ region of FIG. 4. However, the resistive value of the N+ region becomes higher and a power loss is increased, resulting in the slowing down of the operation speed of the circuit.

SUMMARY OF THE INVENTION

The primary object of this invention is to provide a method for manufacturing the above-mentioned nonvolatile semiconductor memory device.

In order to attain the above-mentioned object, a nonvolatile semiconductor memory device of this invention comprises a first type MOS transistor having a source region, drain region and gate electrode and a second type MOS transistor having a source region, drain region, first gate and second gate above the first gate to provide a double gate structure, in which the width of an overlap between the first gate and the drain region in the second type MOS transistor is smaller than that of an overlap between the gate and the drain region in the first type MOS transistor.

A nonvolatile semiconductor memory device so formed is such that an overlap between a floating gate and a drain region of the transistor becomes smaller. In consequence, a potential on the floating gate as induced when high voltage is applied to the drain region becomes smaller than in the conventional device. As the leakage current of the nonselected memory cell is decreased, a lowering of a potential on the column line when data is written ceases to exist, and the writing time is quickened. It is not necessary to consider an erroneous writing operation with respect to the nonselected memory cell.

The above-mentioned nonvolatile semiconductor memory device is formed by forming a first electroconductive layer which is superposed on a semiconductor substrate with a first insulating film interposed therebetween, forming a second electroconductive layer which is superposed on the first electroconductive layer with a second insulating film interposed therebetween, forming a second gate by selectively etching the second electroconductive layer, forming a first gate by selectively etching the first electroconductive layer and forming a source region and drain region by introducing an impurity on the semiconductor substrate with the second gate as a mask.

The gate of the MOS transistor of the peripheral circuit is formed from the first electroconductive layer and this transistor is used as a driver MOS transistor. The gate of the MOS transistor of a peripheral circuit may thus be formed from the second electroconductive layer and this is used as a load MOS transistor. The channel length of the driver MOS transistor is shorter than that of the load MOS transistor and it is possible to provide a memory device of a higher density. The output level of the load transistor whose gate electrode is formed from the second electroconductive layer can be made higher than that of the load transistor whose gate electrode is formed from the first electroconductive layer and thus the load transistor whose gate electrode is formed from the second electroconductive layer effectively functions as such.

BRIEF DESCRIPTION OF THE DRAWING

Other objects and advantages of this invention will become apparent from the following detailed description when taken in conjunction with the accompanying drawings, in which:

FIG. 8 shows a relation of threshold voltage to the boron implantation quantity;

FIG. 9 is a graph showing a relation of substrate voltage to an increase in threshold voltage;

FIG. 10 is a graph showing a relation of an effective channel length to a threshold voltage difference;

FIGS. 11a to 11l are cross-sectional views showing a semiconductor substrate for explaining a method for manufacturing a nonvolatile memory device having a floating gate type MOS transistor, driver MOS transistor and load MOS transistor;

FIG. 14 shows a circuit diagram of an address buffer circuit using a driver MOS transistor and load MOS transistor of this invention.

DESCRIPTION OF THE PREFERRED EMBODIMENTS

Figure 5:
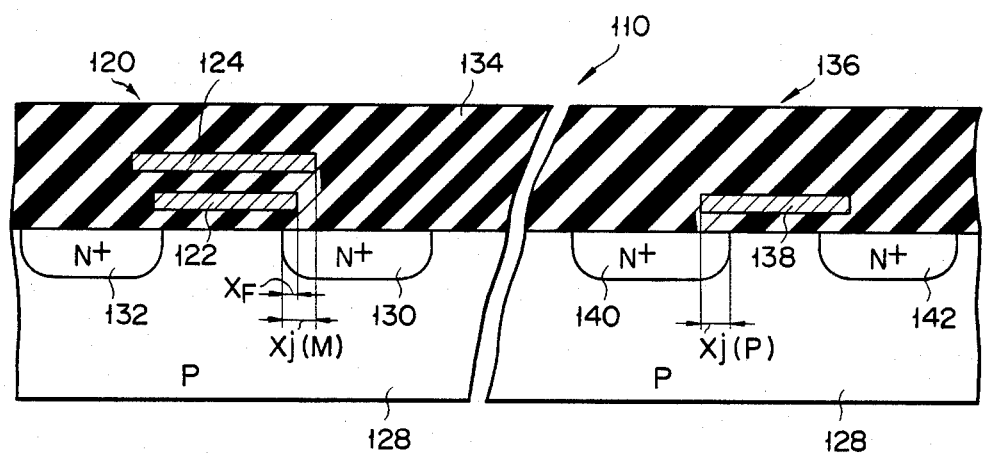
FIG. 5 is a cross-sectional view showing a nonvolatile memory device according to one embodiment of this invention.

One embodiment of this invention will be explained below by referring to FIG. 5.

Figure 1:
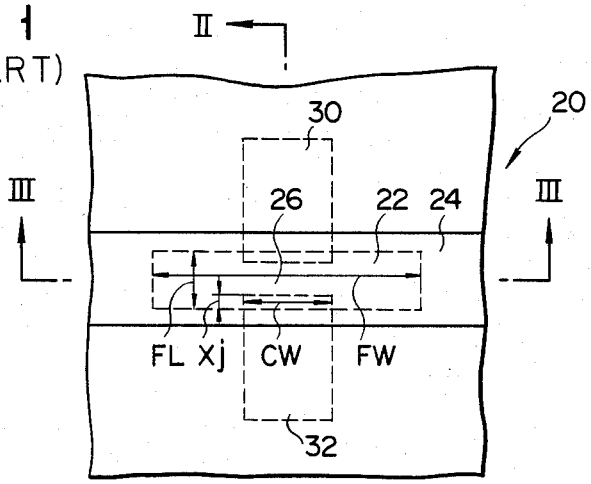
FIG. 1 is a plan view of a nonvolatile memory device showing a capacitance formation state of a nonvolatile memory.
Figure 2:
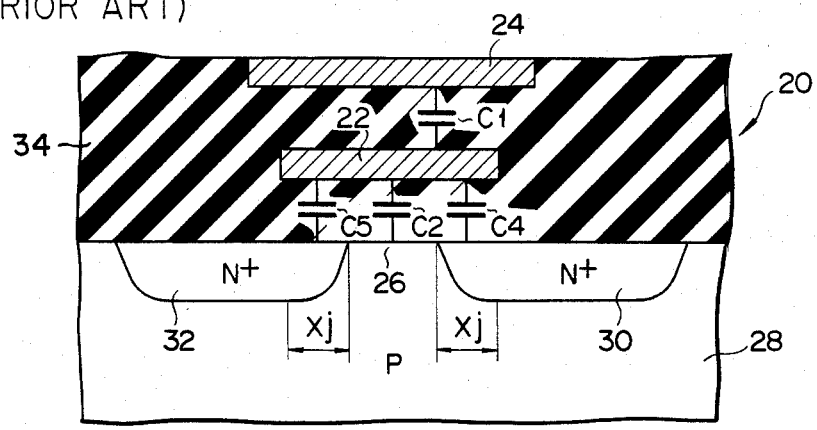
FIG. 2 is a cross-sectional view showing the nonvolatile memory device as taken along II—II in FIG. 1.
Figure 3:
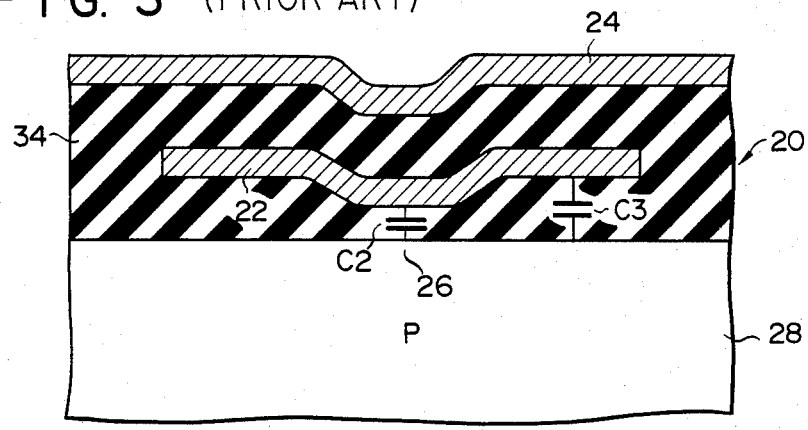
FIG. 3 is a cross-sectional view showing the nonvolatile memory device as taken along III—III in FIG. 1.
Figure 4:
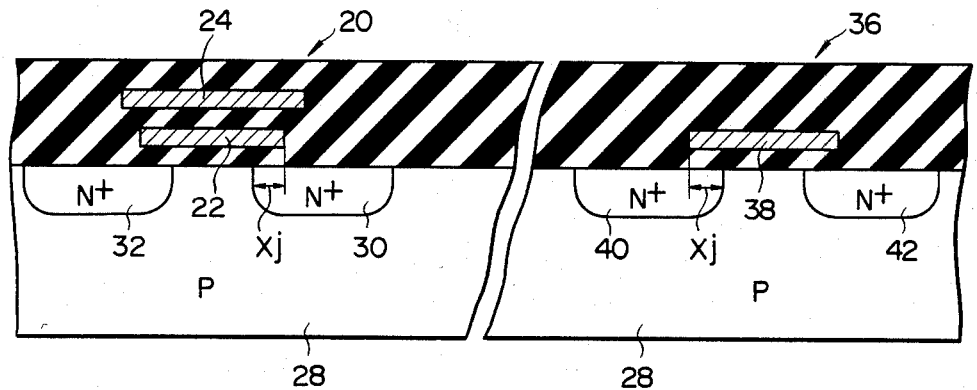
FIG. 4 is a cross-sectional view showing a conventional nonvolatile memory device.

A nonvolatile semiconductor memory device 110 comprises a memory cell 120 comprised of a floating gate type MOS transistor having a floating gate 122 and control gate 124, and a MOS transistor 136 having a gate electrode 138. An N+-type source region 132 and drain region 130 of the memory cell 120 are formed on a semiconductor substrate 128 with the control gate 124 as a mask. The source region 142 and drain region 140 of the MOS transistor of the peripheral circuit are also simultaneously self-aligned with the gate electrode as a mask. Thus, a length $X_j(M)$ of an overlap between the control gate 124 and the drain region 130 of the memory cell 120 is equal to a length $X_j(P)$ of an overlap between the gate electrode 138 and source/drain region of the MOS transistor 136. The floating gate 122 of the memory cell 120 can be self-aligned with the control gate 124 as a mask and the length of floating gate 122 becomes shorter than that of control gate 124. Therefore a length $X_F$ of an overlap between the floating gate 122 and the drain region 130 can be made smaller than the length $X_j(M)$. The lengths $X_j(M)$ and $X_j(P)$ are the same as those of the conventional memory device 20 (see FIG. 4). Thus, the length $X_F$ of the overlap between the floating gate 122 and the drain region 130 is smaller than the length $X_j$ of the conventional memory device 20, and the capacitance C4 between the drain region 130 and the floating gate 122 of the memory cell 120 becomes smaller than that of the conventional memory device. If, as a result, high voltage is applied to the drain region 130 of the nonselected memory cell 120 in a writing operation, a potential $V_F$ as induced on the floating gate 122 becomes smaller. For this reason, the leakage current is decreased, a lowering of a potential on the selected column line on which data is written becomes smaller, and the time required for writing operation is decreased. There is no chance of effecting an erroneous writing operation with respect to the non-selected memory cell.

On the other hand, a small rise in potential $V_F$ of the floating gate occurs and it is possible to make a voltage $V_{TH}$ lower than that in the conventional nonvolatile memory cell. Because in this case the current flowing through the memory cell can be increased at the read-out mode, charging and discharging can be quickly carried out on the column line, permitting the provision of a high-speed device.

Viewed from the column line, a decrease in the capacitance C4 results in a decrease in the capacitance of the column line. This also permits the provision of a high-speed unit.

The length of the control gate can be made greater than the length of the floating gate by forming the floating gate with the control gate as a mask. The potential $V_F$ on the floating gate can be effectively raised by the edge effect of the gate. The potential $V_F$ can be expressed as follows:

$$V_F = \frac{C1}{C1 + C2 + C3 + C4 + C5} V_G = \alpha V_G$$

$\alpha$ in this equation can be made greater because the length of the control gate is greater than that of the floating gate and it is possible to obtain the same potential $V_F$ by a smaller $V_G$.

The N+-type source/drain regions so formed have the depth of junction the same as that of the conventional floating gate type MOS transistor and thus the resistance of the source/drain regions can be kept smaller, these being no possibility of causing an increase in power loss as well as a decrease of the operation speed. Moreover, the breakdown voltage of the PN junction can be made equal to that of the conventional floating gate type MOS transistor, because the N+-type source/drain regions have the depth of junction the same as that of the conventional ones.

Figure 6A:
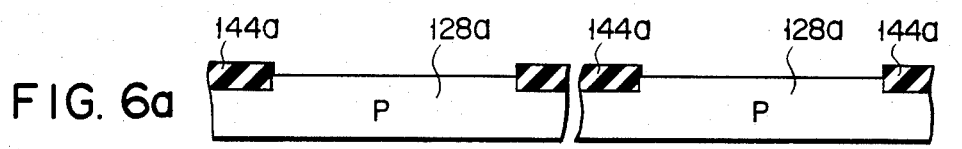
FIGS. 6a to 6f are cross-sectional views showing a semiconductor substrate for explaining a method for manufacturing a nonvolatile memory device of this invention.
Figure 6B:
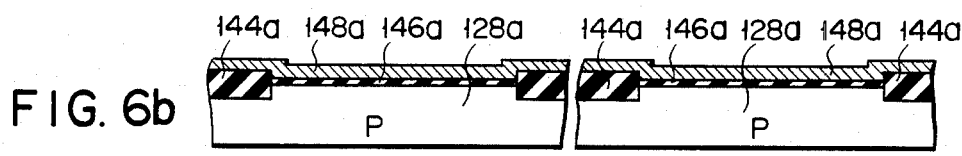
Figure 6C:
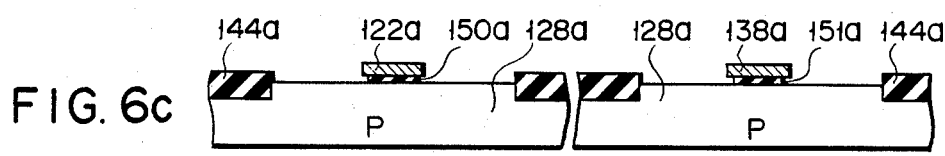

A method of integrating MOS devices of single and double gate structure of this invention in a method for manufacturing a nonvolatile semiconductor memory device will be explained below by referring to FIGS. 6a to 6f. Note that as an example, the method produces an element on the right side of these Figures such as a MOS transistor 136a and an element on the left side of these Figures such as a memory cell 120a. The P-type semiconductor substrate 128a is selectively oxidized by a photo etching technique to form a field oxide film 144a as shown in FIG. 6a. The exposed portion of the semiconductor substrate 128a is thermally oxidized to form a first oxide film 146a as shown in FIG. 6b. Then, a photo resist layer (not shown) is formed on the oxide film, and the resist layer portions overlying the future channel formation regions of a memory cell 120a on the left and MOS transistor 136a on the right are selectively removed, followed by the ion implantation of P-type atoms such as boron to obtain a proper threshold voltage. Thereafter, the remaining resist layer is removed. A first polysilicon layer 148a is formed by a CVD method on the surface of the resultant structure, and the polysilicon layer 148a and first oxide film 146a are selectively removed by a photo etching technique to form a floating gate 122a, gate electrode 138a of the MOS transistor 136a as well as first and second gate oxide films 150a and 151a, under the floating gate and gate electrode, respectively, as shown in FIG. 6c.

Figure 6D:
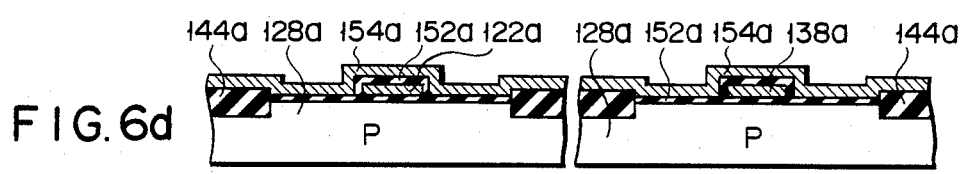
Figure 6E:
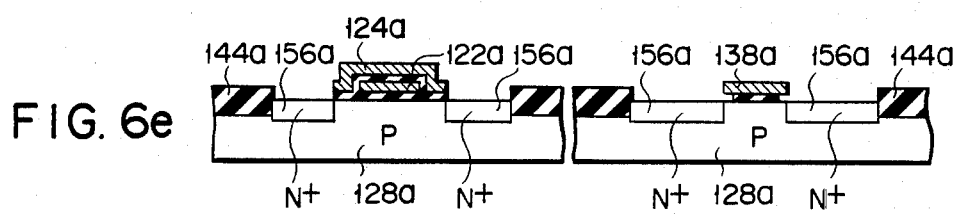

A second oxide film 152a is formed by a thermal oxidation method to cover the exposed surface of the semiconductor substrate 128a, floating gate 122a and gate electrode 138a as shown in FIG. 6d and a second polysilicon layer 154a is formed by the CVD method on the surface of the resultant structure. The second polysilicon layer 154a and second oxide film 152a are selectively removed by photo etching technique to form a control gate 124a, as shown in FIG. 6e, on the floating gate 122a. At the same time, the second polysilicon layer 154a and second oxide film 152a at the location where the MOS transistor 136a is to be formed are removed.

Figure 6F:
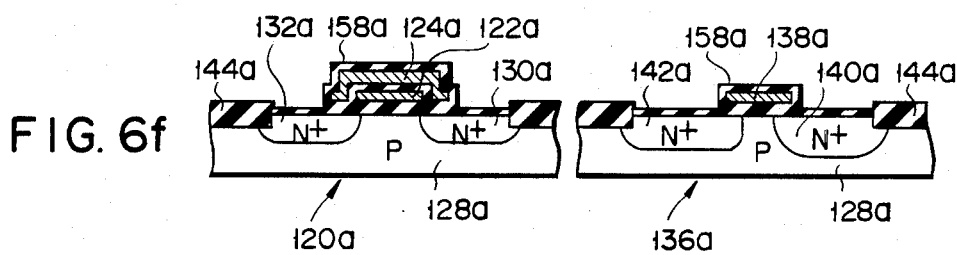

An N+-type impurity is ion-implanted or solid-phase diffused into the exposed surface of the semiconductor substrate with the control gate 124a and gate electrode 138a as a mask to form an N+ regions 156a. Thereafter, the resultant semiconductor is subjected to high-temperature heat-treatment to provide a source region 132a and drain region 130a of the memory cell 120a, and a source region 142a and drain region 140a for the MOS transitor 136a as shown in FIG. 6f. At this heat-treatment step, the surfaces of the semiconductor substrate 128a, floating gate 122a, control gate 124a and gate electrode 138a are thermally oxidized to form a third oxide film 158a.

The memory cell 120a so formed has a small overlap between the drain region 130a and the floating gate 122a, making the capacitance C4 between the drain 130a and the floating gate smaller.

Figure 7A:
FIGS. 7a to 7h are cross-sectional views showing a semiconductor substrate for explaining another method for manufacturing a nonvolatile memory device of this invention.

Another manufacturing method will be explained by referring to FIGS. 7a to 7h. A MOS transistor 136b is shown on the right side of these Figures and a memory cell 120b on the left side of these Figures. A P-type semiconductor substrate 128b is selectively oxidized by a photo etching technique to form a field oxide film 144b as shown in FIG. 7a. The exposed portion of the semiconductor substrate 128b is thermally oxidized to form a first oxide film 146b. A photo resist layer is formed on the surface of the resultant structure. The resist portion above the channel formation area of the memory cell 120b is selectively removed and P-type atoms such as boron (B) are ion-implanted on the channel formation area to obtain a proper threshold voltage. Then, the resist layer is removed.

Figure 7B:
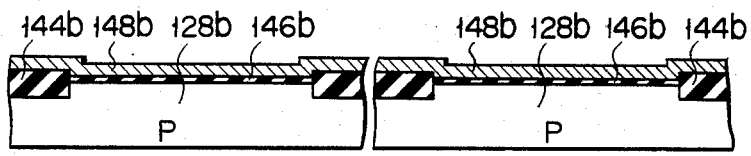
Figure 7C:
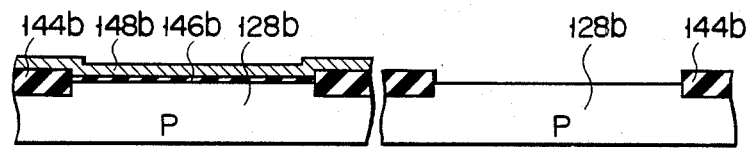
Figure 7D:
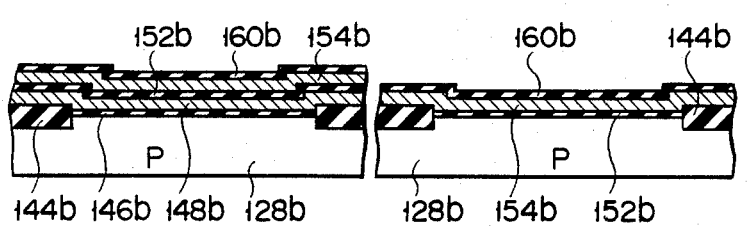
Figure 7E:
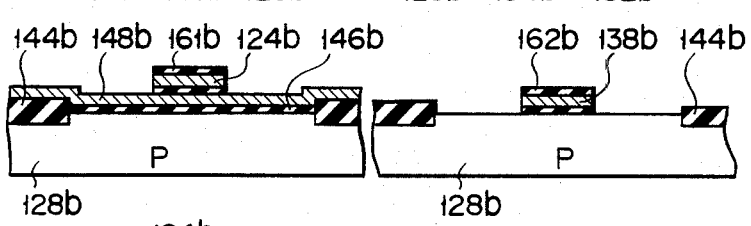

A first polysilicon layer 148b containing phosphorus (P) is formed by a CVD method on the first oxide film 146b as shown in FIG. 7b. The first polysilicon layer 148b of the MOS transistor 136b the other unnecessary first polysilicon layer and first oxide film 146b are selectively removed as shown in FIG. 7c. A second oxide film 152b is formed, as shown in FIG. 7d, wholly over one surface of the semiconductor substrate of FIG. 7c. A resist layer is formed on the surface of the resultant structure and that resist layer portion overlying the channel formation area of the MOS transistor 136b is selectively removed and a P-type impurity such as boron (B) is ion-implanted to obtain a predetermined threshold voltage. The remaining resist layer is removed and a second polysilicon layer 154b is formed by the CVD method on the surface of the resultant structure, and a fourth oxide film 160b is formed on the resultant surface. The fourth oxide film 160b, second polysilicon layer 154b and second oxide film 152b of the MOS transistor of the memory cell are selectively etched to form a control gate 124b and gate electrode 138b as shown in FIG. 7e.

Figure 7F:
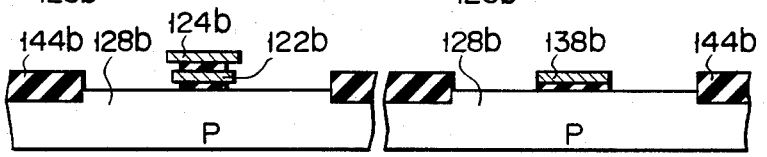

The first polysilicon layer 148b of the memory cell is etched with the fourth oxide film pattern 161b (on the control gate 124b) as a mask to form a floating gate 122b, as shown in FIG. 7f, in self-alignment. The first oxide film 146b is selectively removed and at the same time the fourth oxide film patterns 161b and 162b are removed. Since the first polysilicon layer 148b contains phosphorus, the first polysilicon layer 148b is faster in its etching rate than that of the control gate 124b. If, therefore, the first polysilicon layer 148b is overetched for a predetermined time of period, the length of the floating gate 122b can be made shorter than that of the control gate 124b.

Figure 7G:
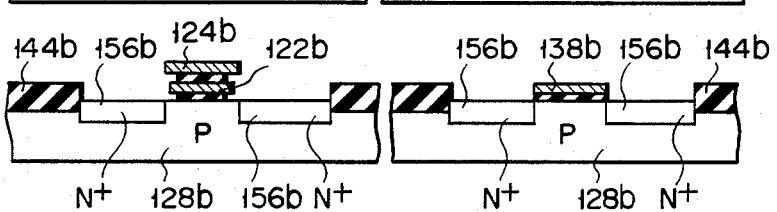
Figure 7H:
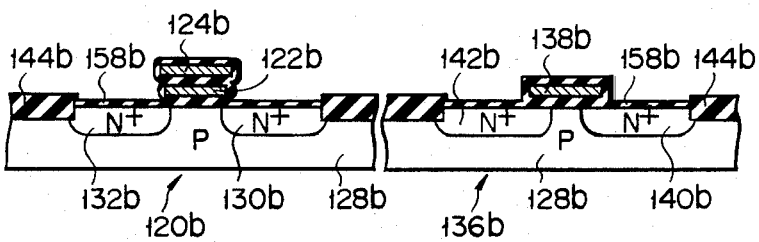

With the control gate 124b and gate electrode 138b as a mask an N-type impurity is ion-implanted on the exposed surface of the semiconductor substrate 128b to form N+ regions 156b as shown in FIG. 7g. The N-type impurity is diffused by high-temperature heat-treatment to form a source region 132b and drain region 130b of the memory cell 120b and source region 142b and drain region 140b of the MOS transistor 136b as shown in FIG. 7h. At the high-temperature heat-treatment step, the surfaces of the semiconductor substrate 128b, floating gate 122b, control gate 124b and gate electrode 138b are thermally oxidized to form a third oxide film 158b.

The memory cell 120b so formed has a small overlap between the drain region 130b and the floating gate 122b and thus the capacitance C4 formed between the drain 130b and the floating gate can be made smaller.

In the above-mentioned two kinds of nonvolatile semiconductor memory devices, the gate electrode 138a of the MOS transistor 136a is formed of the first polysilicon layer 148a of a material the same as that of the floating gate 122a of the memory cell 120a, and the gate electrode 138b of the MOS transistor 136b is formed of the second polysilicon layer 154b of a material the same as that of the control gate 124b of the memory cell 120b. It is to be noted that the threshold voltage of the MOS transistor, for example, the N-channel MOS transistor is determined by ion-implanting a P-type impurity such as boron (B) in the channel formation area. The ion implantation step is carried out before the gate electrode of the MOS transistor is formed. That is, for the MOS transistor (hereinafter referred to as the first polysilicon transistor) using the first polysilicon layer as the gate electrode, boron is ion-implanted before the first polysilicon layer is formed and, for the MOS transistor (hereinafter referred to as the second polysilicon transistor) using the second polysilicon layer as the gate electrode, such ion implantation is effected before the second polysilicon layer is formed. The first polysilicon layer is formed earlier in time than the second polysilicon layer and subjected to the various subsequent heat treatments.

Boron as ion-implanted in the channel area of the first polysilicon transistor is diffused deeper into the semiconductor substrate than boron as ion-implanted in the channel area of the second polysilicon transistor. If therefore an equal amount of boron is ion-implanted, the boron concentration in the channel formation area is lower for the first polysilicon transistor than for the second polysilicon transistor. In order to obtain the same threshold voltage, therefore, more boron is ion-implanted in the channel formation area of the first polysilicon transistor. This state is shown in FIG. 8. The curve $\alpha$ in FIG. 8 shows a relation of the threshold voltage of the first polysilicon transistor to the boron implantation quantity and curve $\beta$ in FIG. 8 shows a relation of the threshold voltage of the second polysilicon transistor to the boron implantation quantity.

Suppose, for example, that equal threshold voltages are involved when the substrate potentials on the first and second polysilicon transistors are zero. If in this case a variation of each threshold voltage when the substrate potential $V_B$ varies (i.e. the substrate bias characteristic) is such that the impurity concentration of the semiconductor substrate behaves as if it were higher on the first polysilicon transistor side than on the second polysilicon transistor side. It is because, for the first polysilicon transistor, boron is entered deep into the semiconductor substrate.

FIG. 9 shows the above-mentioned substrate bias characteristic. In FIG. 9 the abscissa shows the square root of the substrate potential and the ordinate shows a difference $\Delta V_{TH}(1)$ between the threshold voltage when the substrate potential is zero volt and the threshold voltage when the substrate potential is applied. In FIG. 9, the curve $\gamma$ denotes the characteristic of the first polysilicon transistor and curve $\delta$ denotes the characteristic of the second polysilicon transistor.

FIG. 10 shows a relation of an effective channel length $L_{eff}$ to a difference $V_{TH}(L=40 \mu M) - V_{TH}(L_{eff})$ between the threshold voltage $V_{TH}$ (L=40 $\mu$m) of a MOS transistor having a channel length L of 40 $\mu$m and the threshold voltage $V_{TH}$ ($L_{eff}$) of a MOS transistor having an effective channel length $L_{eff}$. Here, the effective channel length $L_{eff}$ is obtained by subtracting a lateral diffusion length $X_j$ of the source/drain regions from a length x of the gate electrode of the MOS transistor ($x-2X_j$).

FIG. 10 shows such an effect (i.e. the short channel effect) that, the shorter the channel length, the lower the threshold voltage becomes. The curve $\epsilon$ shows the characteristic of the first polysilicon transistor and the curve $\xi$ shows the characteristic of the second polysilicon transistor. At the effective channel length of nearly below 2.0 $\mu$m the first polysilicon transistor manifests the short channel effect and at the effective channel length of nearly below 2.5 $\mu$m the second silicon transistor reveals the short channel effect. A drop in the threshold voltage of the first polysilicon transistor does not occur until the effective channel length becomes shorter than for the second polysilicon transistor. For this reason, the channel length of the first polysilicon transistor can be made shorter than that of the second polysilicon transistor. The threshold voltage of the first polysilicon transistor is stabilized up to the shorter channel length and if, therefore, the first polysilicon transistor is used for the driver transistor, a more microminiature element can be produced than when the second polysilicon transistor is used, permitting the provision of a high-integration nonvolatile semiconductor memory device.

The threshold voltage of the first polysilicon transistor has a greater substrate bias characteristic than that of the second polysilicon transistor. If, therefore, the first polysilicon transistor is used for the load transistor, the output voltage is lower than when the second polysilicon transistor is used as the load transistor. Suppose, for example, that the threshold voltage $V_{TH}$ of the first and second polysilicon transistors is 1 V and that the drain voltage $V_D$ and gate voltage $V_G$ are 5 V. In this case, the following voltage $V_S$ appears from the respective sources of the transistors.

$$V_S = V_G - (V_{TH} + \Delta V_{TH})$$

Between the source voltage $V_S$ and the substrate voltage $V_B$ there exists a relation of $V_S = -V_B$.

$$\sqrt{-V_B} = \sqrt{V_G - (V_{TH} + \Delta V_{TH})} \quad (3)$$

$$= \sqrt{4 - \Delta V_{TH}}$$

Equation (3) is indicated by the curve $\eta$ in FIG. 9. From the intersections of the curve $\eta$ with the curves $\gamma$ and $\delta$ it is evident that the source voltage $V_S$ of the first polysilicon transistor is about 3.2 V and that the source voltage $V_S$ of the second polysilicon transistor is about 3.4 V. In this way, the output voltage of the second polysilicon transistor is higher than the output voltage of the first polysilicon transistor by 0.2 V. As a result, it is preferable to use the second polysilicon transistor as the load transistor and in this case a wider power supply margin is secured.

Figure 11A:
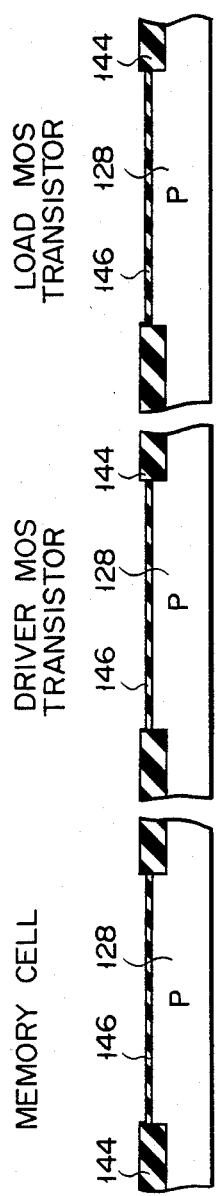
Figure 11B:
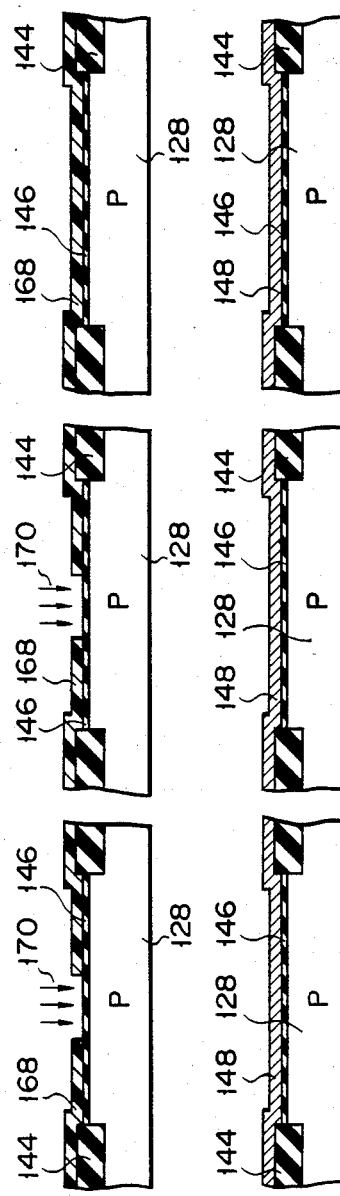
Figure 11C:
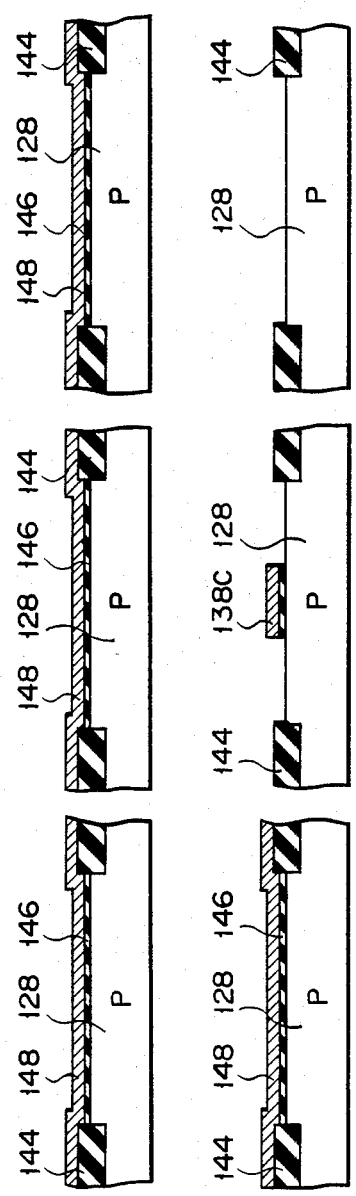
Figure 11D:
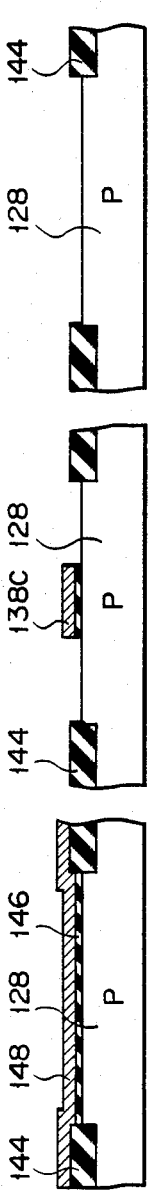

A method for the manufacture of a preferred nonvolatile semiconductor memory device will be explained below by FIGS. 11a to 11l. In these Figures, a load MOS transistor 164 (see FIG. 11l) is indicated to the right, a driver MOS transistor 166 (see FIG. 11l) of the circuit is at the middle and a memory cell 120 (see FIG. 11l) is composed of a floating gate type MOS transistor to the left. A P-type semiconductor substrate 128 is selectively oxidized by a photo etching technique to form a field oxide film 144 as shown in FIG. 11a. The exposed portion of the semiconductor substrate 128 is thermally oxidized to form a first oxide film 146. A photo resist layer 168 is formed on the surface of the resultant structure as shown in FIG. 11b. The resist layer portions overlying the memory cell 120 and driver MOS transistor 166 are selectively removed and P-type atoms 170 such as boron (B) are ion-implanted in the channel formation area to obtain a predetermined threshold voltage. Then, the resist layer 168 is removed and a first polysilicon layer 148 containing phosphorus (P) is formed by a CVD method on the first oxide film 146 as shown in FIG. 11c. The first polysilicon layer 148 and first oxide film 146 of the driver MOS transistor 166 are selectively removed to form a gate electrode 138c of the driver MOS transistor 166 as shown in FIG. 11d and the first polysilicon layer 148 and first oxide film 146 in the load MOS transistor 164 are removed.

As shown in FIG. 11e, a second oxide film 152 is formed over the whole surface of the semiconductor chip as shown in FIG. 11e. A resist layer 168 is formed on the second oxide film 152 as shown in FIG. 11f. The resist layer portion overlying the channel formation area of the load MOS transistor 164 is selectively removed and a P-type or N-type impurity 170 such as boron or phosphorus, respectively, is ion-implanted to obtain predetermined threshold voltage. Then, a resist layer is removed. A second polysilicon layer 154 is formed by a CVD method on the surface of the second oxide film 152 and a fourth oxide film 160 is formed on the surface of the layer 154 (see FIG. 11g). The fourth oxide film 160, second polysilicon layer 154 and second oxide film 152 of the memory cell, driver MOS transistor and load MOS transistor are selectively etched to form a control gate 124, gate electrode 138c of the driver MOS transistor 166 and gate electrode 138d of the load MOS transistor 164. Then, a resist layer is formed. The resist layer is removed except for the portion 168a overlying the gate electrode 138c, as shown in FIG. 11i. The first polysilicon layer 148 of the memory cell is etched with an oxide film pattern 161 (on the control gate 124) as a mask to form a floating gate 122, as shown in FIG. 11i, by self-aligned method. After the resist layer is removed, a first oxide film 146 is selectively removed as shown in FIG. 11j. At the same time, the fourth oxide film patterns 161 and 162 are removed. As the first polysilicon layer 148 contains phosphorus, it is faster in etching rate than that of the control gate 124. If, therefore, the first polysilicon layer 148 is overetched for a predetermined time of period, the length of the floating gate 122 can be made shorter than that of the control gate 124.

An N-type impurity is ion-implanted in the exposed surface of the semiconductor substrate 128 with the control gate 124 and gate electrodes 138c and 138d as a mask to form an N+ region 156 as shown in FIG. 11k. The N-type impurity is diffused by high-temperature heat-treatment to form a source region 132 and drain region 130 of the memory cell 120, source region 142c and drain region 140c of the driver MOS transistor 166 and source region 142d and drain region 140d of the load MOS transistor 164 as as shown in FIG. 11l. In the high-temperature heat-treatment step, the surfaces of the semiconductor substrate 128, floating gate 122, control gate 124 and gate electrodes 138c and 138d are thermally oxidized to form a third oxide film 158.

A nonvolatile semiconductor memory device so constructed has a small overlap between the drain region 130 and the floating gate 122 and thus it is possible to make smaller a capacitance C4 between the drain region 130 and the floating gate 122. The first polysilicon transistor having the gate electrode 138c made of the first polysilicon layer 148 is used as the driver transistor and the second polysilicon transistor having the gate electrode 138d made of the second polysilicon layer 154 is used as the load transistor. This permits the chip size to be decreased and the output level of the load transistor to be adequately increased.

Figure 12:
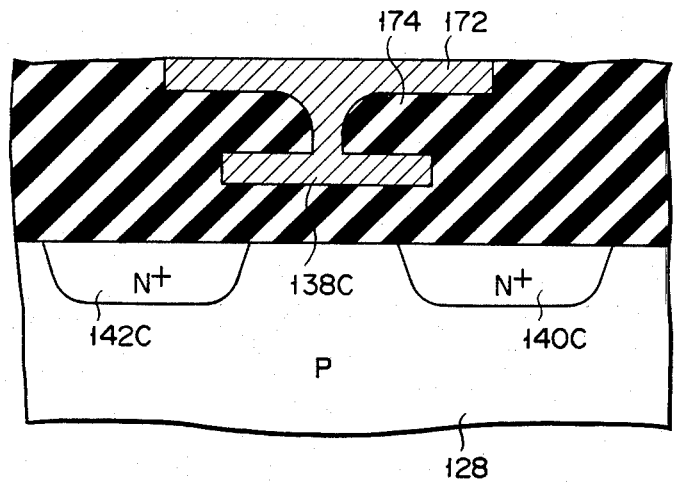
FIG. 12 is a cross-sectional view showing the driver MOS transistor of this invention.

In the first polysilicon transistor as shown in FIG. 12, connecting may be effected between the first gate electrode 138c made of the first polysilicon layer and the second polysilicon pattern (the second gate electrode) 172 made of the second polysilicon layer. The oxide film 174 on the gate electrode 138c may be selectively etched to provide an opening through which the second polysilicon pattern 172 is formed. If the second polysilicon pattern 172 is formed as a part of the memory cell, it serves as a control gate.

Figure 13:
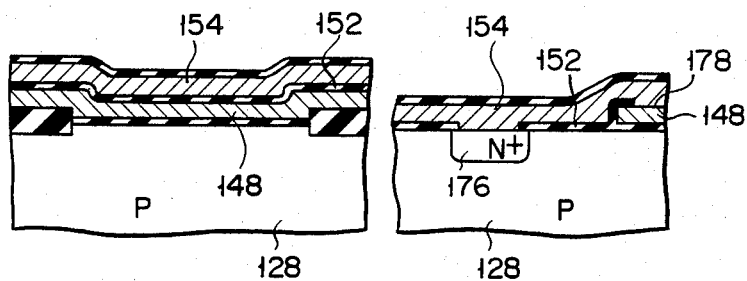
FIG. 13 is a cross-sectional view showing a semiconductor substrate for explaining a method for manufacturing a driver MOS transistor of this invention.

If a step for connecting the second polysilicon layer 154 directly to an N+ region 176, as shown in FIG. 13, which is connected to the first polysilicon layer 148 is used, another first polysilicon transistor can be formed without any extra connecting process.

In the MOS type integrated circuit, in general, the surface of a semiconductor substrate is exposed before the formation of a polysilicon layer; the polysilicon layer is connected directly to the exposed surface of the semiconductor substrate; phosphorus contained in the polysilicon layer is diffused into the substrate to form an N+ region or phosphorus is diffused through the polysilicon layer into the substrate to form an N+ region. As a result, the polysilicon layer is connected to the N+ region. That is, the N+ region underlying the polysilicon layer is connected to the drain and source of the transistor and interconnection N+ layer to permit the polysilicon layer to be connected directly to the N+ layer. If such a step (i.e. a step for connecting the polysilicon layer directly to the N+ layer) is not included, the N+ layer is connected to an interconnection metal layer, such as aluminum, for interconnection to the peripheral circuit, the metal interconnection layer is connected to the polysilicon layer. As a result, the polysilicon layer is connected indirectly, i.e. through the interconnection metal layer, to the N+ layer. Interposing such interconnection metal layer is disadvantageous from the standpoint of an integration density. For this reason, a method is often adopted to connect the N+ layer directly to the polysilicon layer.

In order to expose the substrate surface the second oxide film 152 is selectively removed as shown in FIG. 13. If the second polysilicon layer 154 is subsequently formed, the second polysilicon layer 154 is connected directly to the substrate 128 and phosphorus is diffused from the second polysilicon layer 154 into the substrate 128. If the second oxide film 152 on the first polysilicon layer 148 is selectively etched in the removal of the second oxide film 152, the surface of the first polysilicon layer 148 is exposed and if the second polysilicon layer 154 is subsequently formed the first and second polysilicon layers 148, 154 are connected through a selectively etched portion 178. That is, the second polysilicon layer 154 is directly connected to the N+ layer 176 and at the same time the first and second polysilicon layers 148, 154 are connected to each other.

In the embodiment as shown in FIGS. 12 and 13, if the gate electrode of the first polysilicon transistor is self-aligned with the second polysilicon layer as a mask, the first polysilicon transistor can be manufactured without providing any additional step. That is, the oxide film 162 (see FIG. 11i) on the second polysilicon layer protects the gate electrode 138c and thus a step for covering the gate electrode 138c with the resist layer can be omitted. If the gate electrode of the first polysilicon transistor is self-aligned with the second polysilicon layer as a mask and the first and second polysilicon layers are connected to each other to form a first polysilicon transistor, extension of the drain N+ region down into the gate electrode is shortened, i.e. a capacitance between the drain region (N+ region) and the first polysilicon layer (gate electrode) is decreased. A decrease in capacitance between the drain region and the gate electrode leads to a decrease in Miller feedback capacitance i.e., gate-to-drain negative feedback capacitance. If such transistor is used as a driver transistor, a quick response speed results.

The application of the first and second polysilicon transistors will be explained below by referring to FIG. 14.

FIG. 14 shows one form of address buffer circuit for delivering an address input to a decoder. Transistors T1, T2 and T3 are connected in series between a power supply $V_{DD}$ (for example, 5 V) and a reference potential $V_{SS}$ (for example, 0 V), and constitute an inverter I1. Here, the transistors T1 and T2 are load transistors made of second polysilicon transistors, and the transistor T3 is a driver transistor made of a first polysilicon transistor. The gate of the transistor T1 is coupled to a chip enable signal CE, and the gate of the transistor T2 is connected to the source of the transistor T2. The transistor T2 is a depletion type transistor and an address signal A1 is supplied to the gate of the transistor T3.

Likewise, an inverter I2 is comprised of transistors T4, T5 and T6 connected in series between $V_{DD}$ and $V_{SS}$. The transistors T4 and T5 are load transistors whose gate electrodes are made of a second polysilicon layer. A transistor T6 to which an output of the inverter I1 is inputted has its gate electrode made of a first polysilicon layer. A transistor T7 is connected between an output line of the inverter I2 and the reference potential $V_{SS}$, and the gate of the transistor T7 is formed of the first polysilicon layer and supplied with an inverted signal $\overline{CE}$ of the chip enable signal. The inverter I3 has the same arrangement as that of the inverter I2. Transistors T8, T9 and T10 are connected in series between $V_{DD}$ and $V_{SS}$ and a transistor T11 equivalent to the transistor T7 is connected to a common node of the transistors T9 and T10.

The transistors T12 and T13 are connected in series between a power supply $V_{DD}$ and a reference potential $V_{SS}$ and constitute a buffer circuit B1. An output of the inverter I3 is supplied to the gate of the transistor T13 made of the first polysilicon layer and an output of the inverter I2 is supplied to the gate of the transistor T12 made of a second polysilicon layer. A signal A2 equivalent to the address signal A1 appears on a node Q1 of the transistors T12 and T13.

A buffer circuit B2 comprises transistors T15 and T14, the gate of the transistor T15 being made of the first polysilicon layer and supplied with an output of the inverter I2 and the gate of the transistor T14 being made of the second polysilicon layer and supplied with an output of the inverter I3. Transistors T14 and T15 are connected in series between a power supply $V_{DD}$ and a reference potential $V_{SS}$, the power supply $V_{DD}$ being connected to the transistor T14 and the reference potential $V_{SS}$ being connected to the transistor T15. An inverted signal $\overline{A2}$ of the output signal A2 in the buffer circuit B1 is connected to a common node Q2 of the transistors T14 and T15.

The transistors T1, T4 and T8 supplied with the signal CE and transistors T7 and T11 supplied with the signal $\overline{CE}$ are provided to decrease a consumption current at the inoperative state of the memory. That is, at the inoperative state of the memory, CE="0" and, since the gates of the transistors T1, T4 and T8 are "0", no consumption current flows through the inverters I1, I2 and I3. As $\overline{CE}$="1", the transistors T7 and T11 are operated and the outputs of the inverters I2 and I3 become a zero level. The gates of the transistors T12 and T14 being a "0" level, no electric current flows through the buffer circuits B1 and B2. As shown in FIG. 14, as the load transistors T12 and T14 are formed of the second polysilicon transistors, an output "1" of sufficient level is outputted from nodes Q1 and Q2 and for the driver transistors T13 and T15 formed of the first polysilicon transistor the channel length of the driver transistor can be shortened, assuring a high integration density.

Another application of this invention will be explained below by referring to FIG. 15.

Figure 15:
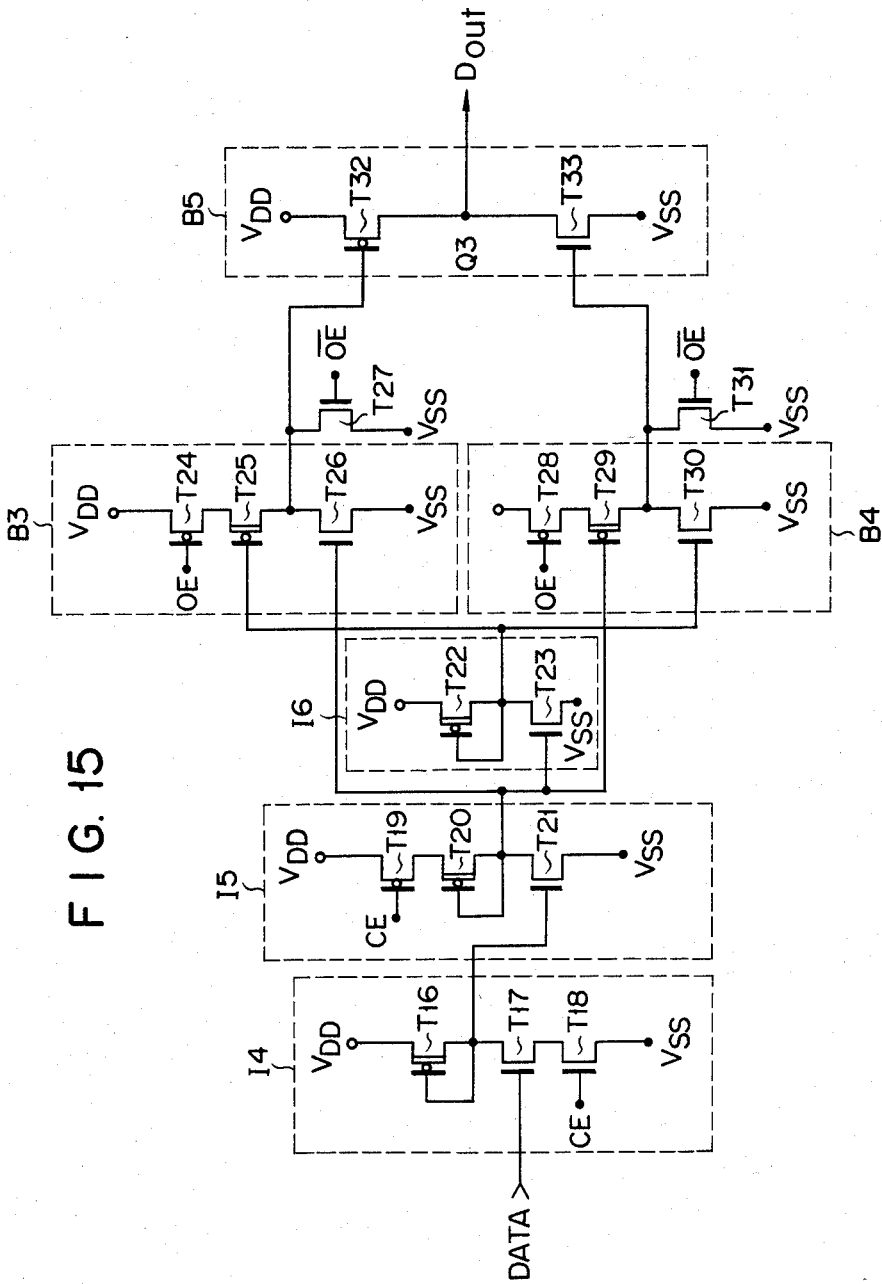
FIG. 15 is a circuit diagram of an output buffer circuit using a driver MOS transistor and load MOS transistor of this invention.

FIG. 15 shows an output buffer circuit for externally outputting data in the integrated circuit. An inverter I4 comprises a transistor T16 whose gate is made of a second polysilicon layer and connected to its source, transistor T17 whose gate is made of a first polysilicon layer and supplied with data in the integrated circuit, and transistor T18 whose gate is formed of the first polysilicon layer and supplied with a chip enable signal CE. The transistors T16, T17 and T18 are connected in series between a power supply $V_{DD}$ and a reference potential $V_{SS}$. The transistor T16 is of a depletion type.

Likewise, an inverter I5 is comprised of transistors T19, T20 and T21. A chip enable signal CE is supplied to the gate of the transistor T19. An output of the inverter I4 is supplied to the gate of the transistor T21.

An inverter I6 comprises a depletion type transistor T22 having its gate connected to its source and transistor T23 whose gate is made of a first polysilicon layer and supplied with the output of inverter I5, the gate of the transistor T22 being formed of a second polysilicon layer. The transistors T22 and T23 are connected in series between the power supply $V_{DD}$ and the reference potential $V_{SS}$.

A buffer circuit B3 comprises a transistor T24 whose gate is formed of a second polysilicon layer and supplied with an output buffer enable signal OE, transistor T25 whose gate is made of the second polysilicon layer and supplied with an output of the inverter I6, and transistor T26 whose gate is formed of the first polysilicon layer and supplied with an output of the inverter I5. The transistors T24, T25 and T26 are connected in series between the power supply $V_{DD}$ and the reference $V_{SS}$. A transistor T27 is connected between an output terminal of the buffer circuit B3 and the reference potential $V_{SS}$, and has its gate formed of the first polysilicon layer and supplied with an inverted signal $\overline{OE}$ of an output buffer enable signal OE.

Likewise, a buffer circuit B4 is comprised of transistors T28, T29 and T30, the gate of the transistor T28 being formed of the second polysilicon layer and adapted to receive the signal OE, the gate of the transistor T29 being formed of the second polysilicon layer and adapted to receive an output of the inverter I5, and the gate of the transistor T30 being formed of the first polysilicon layer and adapted to receive an output of the inverter I6. A transistor T31 is connected between the output of the buffer circuit B4 and the reference potential $V_{SS}$ and has its gate formed of the first polysilicon layer and adapted to receive an inverted signal $\overline{OE}$ of an output buffer enable signal OE.

A buffer circuit B5 is provided for externally outputting data. The buffer circuit B5 comprises a transistor T32 and transistor T33, the gate of the transistor T32 being formed of a second polysilicon layer and adapted to receive an output of the buffer circuit B3 and the gate of the transistor T33 being formed of the first polysilicon layer and adapted to receive an output of the buffer circuit B4. The transistors T32 and T33 are connected in series between the power source $V_{DD}$ and the reference potential $V_{SS}$.

With the chip in the active state, CE="1", $\overline{CE}$="0", OE="1" and $\overline{OE}$="0". Thus, data is delivered to the outside $D_{out}$. With the chip in the inactive state, CE="0", $\overline{CE}$="1", OE="0" and $\overline{OE}$="1". In consequence, electric current in the output buffer circuit becomes substantially zero. The outputs of the buffer circuits B3 and B4 are both at the "0" level, causing the transistors T32 and T33 to be cut off. As a result, the output of the buffer circuit B5 becomes a high impedance state. In order to make the output of the output buffer circuit at a high impedance state with the chip in an operative state it is necessary that CE="1", $\overline{CE}$="0", OE="0" and $\overline{OE}$="1". Since in this case the transistors T24 and T28 are rendered OFF and transistors T27 and T31 are rendered ON, the outputs of the buffer circuits B3 and B4 become a zero level. In consequence, the transistors T32 and T33 are cut off, offering a high impedance state.

Since, even in the output buffer circuit so constructed, the gate of the transistor T32 is formed of the second polysilicon layer, it is possible to deliver an output of a sufficient level. The gate of the driver transistor T33 is made of the first polysilicon layer, permitting a shortening of its channel length and thus a high integration density.

Although in the above-mentioned embodiment the floating gate, the control gate and the gate in the MOS transistor are made of polysilicon, this invention is not restricted thereto. Instead, it is possible to use an electroconductive layer having the same function.

What we claim is:

1. In a method for manufacturing a nonvolatile semiconductor memory device a method of forming an MOS device of double gate structure comprising the steps of:

forming a first electroconductive layer which is superposed on a semiconductor substrate with a first insulating film interposed therebetween;

forming a second electoconductive layer which is superposed on said first electroconductive layer with a second insulating film interposed therebetween;

forming a control gate by selectively etching said second electroconductive layer;

forming a floating gate by selectively etching said first electroconductive layer with said control gate as a mask, said floating gate being formed to have a length as viewed in a channel direction shorter than that of said control gate in the same direction; and introducing impurities by ion implantation into said semiconductor substrate with said control gate as a mask to form source and drain regions; and thermally processing said source and drain regions to extend these regions into those portions of said semiconductor substrate being under the end portions of said floating gate.

2. The method according to claim 1, further comprising the step of connecting said control and floating gates.

3. The method according to claim 1, wherein said method of forming an MOS device of double gate structure includes a method of integrating an MOS device of single gate structure with the MOS device of double gate structure in which a gate electrode of a first MOS transistor is also formed of the first electroconductive layer.

4. The method according to claim 1, wherein said method of forming an MOS device of double gate structure includes a method of integrating an MOS device of single gate structure with the MOS device of double gate structure in which a gate electrode of a second MOS transistor is formed of the second electroconductive layer.

5. The method according to claim 1, wherein said method of forming an MOS device of double gate structure includes a method of integrating an MOS device of single gate structure with the MOS device of double gate structure in which a gate electrode of a first MOS transistor is formed of the first electroconductive layer and a gate electrode of a second MOS transistor is formed of the second electroconductive layer.

6. The method according to claim 1, wherein said first electroconductive layer has a higher impurity concentration than said second electroconductive layer.

7. The method according to claim 3, in which source and drain regions of said first MOS transistor are formed with said latter gate electrode as a mask.

8. The method according to claim 4, in which source and drain regions of said second MOS transistor are formed with said latter gate electrode as a mask.

9. The method according to claim 5, in which source and drain regions of said first and second MOS transistors are formed with said gate electrodes of said first and second MOS transistors as masks, respectively.

* * * * *